(12) United States Patent
Zhao et al.

(10) Patent No.: US 10,468,564 B1
(45) Date of Patent: Nov. 5, 2019

(54) PACKAGED WHITE LIGHT EMITTING DEVICE COMPRISING PHOTOLUMINESCENCE LAYERED STRUCTURE

(71) Applicant: Intematix Corporation, Fremont, CA (US)

(72) Inventors: Jun-Gang Zhao, Fremont, CA (US); Gang Wang, Sunnyvale, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 16/373,598

(22) Filed: Apr. 2, 2019

Related U.S. Application Data

(60) Provisional application No. 62/820,249, filed on Mar. 18, 2019.

(51) Int. Cl.
| | |
|---|---|
| *H01L 33/50* | (2010.01) |
| *H01L 33/44* | (2010.01) |
| *C09K 11/08* | (2006.01) |
| *F21K 9/64* | (2016.01) |
| *C09K 11/77* | (2006.01) |
| *F21Y 115/10* | (2016.01) |

(52) U.S. Cl.
CPC ........ *H01L 33/504* (2013.01); *C09K 11/0883* (2013.01); *C09K 11/7731* (2013.01); *F21K 9/64* (2016.08); *H01L 33/44* (2013.01); *F21Y 2115/10* (2016.08)

(58) Field of Classification Search
CPC ......... H01L 33/504; H01L 33/44; F21K 9/64; C09K 11/0883; C09K 11/7731; F21Y 2115/10
See application file for complete search history.

(56) References Cited

U.S. PATENT DOCUMENTS

| | | | |
|---|---|---|---|
| 8,890,403 B2 | 11/2014 | Sakuta et al. | |
| 2007/0108888 A1* | 5/2007 | Chen ................... | B82Y 20/00 313/503 |
| 2010/0013373 A1* | 1/2010 | Hata ................... | H01L 33/504 313/502 |
| 2011/0068354 A1 | 3/2011 | Tran et al. | |
| 2014/0231857 A1* | 8/2014 | Nammalwar ........ | C09K 11/617 257/98 |
| 2015/0329770 A1 | 11/2015 | Kaneyoshi et al. | |

(Continued)

*Primary Examiner* — Victor A Mandala (57) ABSTRACT

A white light emitting package (20) comprises: a solid-state excitation source (LED 30) for generating excitation light with a dominant wavelength in a range 440 nm to 470 nm; and a layered photoluminescence structure. The layered photoluminescence structure comprises a first photoluminescence layer (32) comprising from 75 wt % to 100 wt % of a manganese-activated fluoride photoluminescence material of the total photoluminescence material content of the first photoluminescence layer, and a second photoluminescence layer (34) comprising photoluminescence material for generating light with a peak emission wavelength in a range from 500 nm to 650 nm. The second photoluminescence layer is disposed on the first photoluminescence layer and the first photoluminescence layer is in closer proximity to the solid-state excitation source than the second photoluminescence layer.

20 Claims, 5 Drawing Sheets

(56) References Cited

U.S. PATENT DOCUMENTS

| | | | | |
|---|---|---|---|---|
| 2015/0357528 | A1 | 12/2015 | Tsumori et al. | |
| 2016/0097495 | A1* | 4/2016 | Yamamoto | G02B 6/0073 349/65 |
| 2016/0202555 | A1* | 7/2016 | Tanaka | G02B 5/201 349/71 |
| 2017/0125650 | A1* | 5/2017 | Pickett | G02B 6/0073 |
| 2017/0283695 | A1* | 10/2017 | Yoshida | C09K 11/617 |
| 2018/0040786 | A1* | 2/2018 | Chen | H01L 33/60 |
| 2018/0226549 | A1* | 8/2018 | Nakabayashi | C09K 11/617 |
| 2018/0287019 | A1* | 10/2018 | Hashimoto | H01L 33/504 |
| 2019/0194537 | A1* | 6/2019 | Sekiguchi | C09K 11/06 |
| 2019/0198722 | A1* | 6/2019 | Nakabayashi | H01L 33/502 |

* cited by examiner

PRIOR ART

SECTION A-A

PACKAGED WHITE LIGHT EMITTING DEVICE COMPRISING PHOTOLUMINESCENCE LAYERED STRUCTURE

FIELD OF THE INVENTION

Embodiments of the present invention are directed to packaged white light emitting devices comprising photoluminescence material layers. More particularly, although not exclusively, embodiments concern packaged light emitting devices including manganese-activated fluoride photoluminescence materials.

BACKGROUND OF THE INVENTION

Photoluminescence wavelength converted light emitting LEDs ("LEDs") include one or more photoluminescence materials (typically inorganic phosphor materials), which absorb a portion of the excitation light (typically blue) emitted by the LED and re-emit light of a different color (wavelength). Manganese-activated fluoride phosphors such as $K_2SiF_6:Mn^{4+}$ (KSF), $K_2TiF_6:Mn^{4+}$ (KTF), and $K_2GeF_6:Mn^{4+}$ (KGF) have a very narrow red spectrum (Full Width Half Maximum of less than 10 nm for their main emission line spectrum) which makes them highly desirable for attaining high color gamut (NTSC, DCI-P3, Rec2020) in display applications and for attaining a high General Color Rendering Index (CRI Ra) in general lighting applications.

Figure 1:
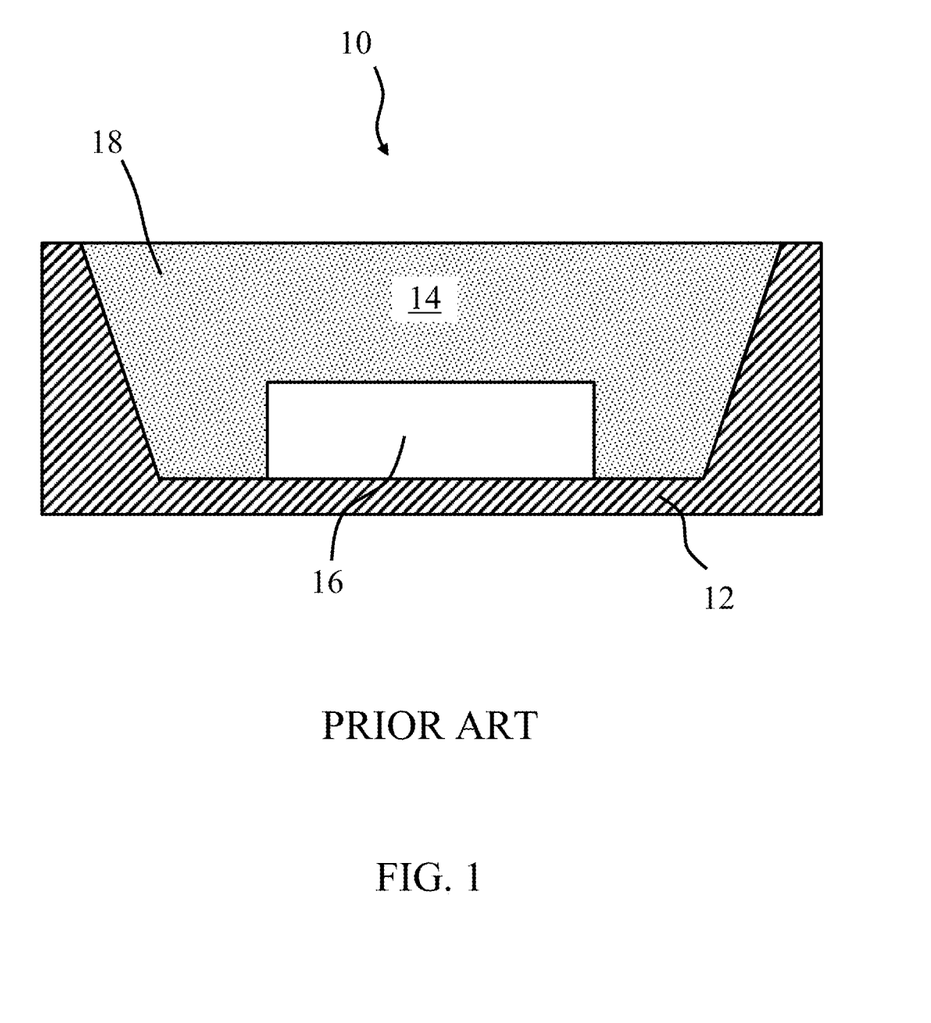
FIG. 1 is a sectional view of a known light emitting device that utilizes manganese activated photoluminescence materials.

FIG. 1 is a sectional view of a known packaged white light emitting device that utilizes a manganese-activated phosphor material. Referring to FIG. 1, the packaged light emitting device 10 comprises a package 12 having a cavity 14 that contains at least one LED die 16. The cavity 14 is filled with a transparent optical encapsulant having a mixture of a manganese-activated fluoride phosphor and a yellow to green light emitting phosphor such as a garnet-based phosphor material dispersed in the encapsulant.

While manganese-activated fluoride photoluminescence materials are highly desirable for the above reasons, there are several drawbacks that make their widespread use challenging. First, the absorption capability of manganese-activated fluoride phosphors is substantially lower (typically about a tenth) than that of europium-activated red nitride phosphor materials (such as CASN) that are currently commonly used in photoluminescence wavelength converted LEDs. Therefore, depending on the application, in order to achieve the same target color point, the usage amount of manganese-activated fluoride phosphors typically can be from 5 to 20 times greater than the usage amount of a corresponding europium-activated red nitride phosphor. The increased amount of phosphor usage significantly increases the cost of manufacture since manganese-activated fluoride phosphors are significantly more expensive than europium-activated red nitride phosphors (at least five times more expensive). As a result of the higher usage and higher cost, use of manganese-activated fluoride red phosphors can be prohibitively expensive for many applications. Moreover, since a very high photoluminescence material loading in silicone is required to achieve the desired color point this can reduce the stability of the dispensing process making it difficult to reliably dispense in packaged devices.

Another problem with fluoride-based phosphor materials is that they readily react with water or moisture which causes damage to the dopant manganese which leads to a reduction or loss of their photoluminescence emission (i.e. quantum efficiency) of the phosphor. Moreover, the reaction of the fluoride-based compound with water can generate very corrosive hydrofluoric acid that can react with LED packaging material thereby leading to component failure.

A further problem with known constructions especially for "warm white" (i.e. 2500K-3000K Correlated Color Temperature) light emitting devices which use manganese-activated fluoride photoluminescence materials is their poor reliability. Currently, this poor reliability makes it impractical to use light emitting devices that comprise manganese-activated fluoride photoluminescence materials in general light applications.

The present invention intends to address and/or overcome the limitations discussed above by presenting new designs and methods not hitherto contemplated nor possible by known constructions. More particularly, there is a need for a cost-effective light emitting device that utilizes less manganese-activated fluoride photoluminescence material, enables a more stable dispensing process during manufacture, improves reliability—particularly in "warm white" applications, and possesses an optimized LED packaging design that may effectively isolate the fluoride-based photoluminescence material from any water/moisture in the surrounding environment.

SUMMARY OF THE INVENTION

Embodiments of the invention relate to packaged white light emitting devices comprising a photoluminescence material layered structure. More particularly, embodiments concern a white light emitting package comprising a photoluminescence layer disposed adjacent to the solid-state excitation source (LED) which, in terms of a total photoluminescence material content within the layer, contains from 75 wt % to 100 wt % manganese-activated fluoride photoluminescence material (phosphor). The devices further comprise a second photoluminescence layer disposed on the first photoluminescence layer containing photoluminescence material that generate light in the green to red region (500 nm to 650 nm) part of the visible spectrum. The inventors have discovered that by locating the manganese-activated fluoride photoluminescence material in an "individual layer" separate from the other photoluminescence materials, the amount of manganese-activated fluoride photoluminescence material required to achieve a given color target can be reduced by as much as 60%. In this patent specification, a packaged light emitting device is used to specify that the photoluminescence material layered structure constitutes a part of the light emitting device package. This is to be contrasted with remote phosphor (photoluminescence) devices in which a phosphor component is provided "remotely" to the excitation source, that is, in a physically spaced relationship and separated by an air gap.

According to an aspect of the invention, there is provided a white light emitting package comprising: a solid-state excitation source for generating excitation light with a dominant wavelength in a range 440 nm to 470 nm; and a layered photoluminescence structure comprising: a first photoluminescence layer comprising from 75 wt % to 100 wt % a manganese-activated fluoride photoluminescence material of a total photoluminescence material content of the first photoluminescence layer, and a second photoluminescence layer comprising photoluminescence material for generating light with a peak emission wavelength in a range from 500 nm to 650 nm; wherein the second photoluminescence layer is disposed on the first photoluminescence layer, and wherein the first photoluminescence layer is in closer proximity to the solid-state excitation source than the second photoluminescence layer. It may be understood that "closer proximity" is used to specify that the first photoluminescence layer is proximal (i.e. a proximal layer) to the excitation source, while the second photoluminescence layer is distal (i.e. a distal layer) to the excitation source. Moreover, "closer proximity" means that there are no other photoluminescence materials in the light path between the solid-state excitation source and the first photoluminescence layer, though there may be light transmissive layers or light transmissive layers containing materials other than photoluminescence materials, for example light diffusive materials. Light emitting devices in accordance with the invention provide an effective solution to address the high usage of manganese-activated fluoride photoluminescence materials in packaged light emitting devices. Providing the manganese-activated fluoride photoluminescence material as a respective layer, that in terms of a total photoluminescence content of the layer, the layer contains a majority (at least 75 wt % of the total photoluminescence material content of the layer) up to exclusively consisting of (100 wt %) manganese-activated fluoride photoluminescence material, is found to significantly reduce the usage amount of the manganese-activated fluoride photoluminescence material within the device (a reduction of from about 25% and 60%) and is found to significantly reduce the usage amount of the total photoluminescence material within the device.

Comparing with known constructions (FIG. 1), a conventional white light emitting device comprises a single photoluminescence layer comprising a mixture of a manganese-activated fluoride photoluminescence material and other (non-fluoride) photoluminescence materials (for example, a green phosphor material, typically a garnet based phosphor material or a red nitride-based phosphor such as CASN). In such an arrangement the manganese-activated fluoride photoluminescence material and other photoluminescence material(s) have equal exposure to excitation light, for example blue excitation light. Since manganese-activated fluoride photoluminescence materials have a much lower blue light absorption capability than other photoluminescence materials (for example, green/yellow garnet-based phosphors or red nitride phosphors), a greater amount of manganese-activated fluoride photoluminescence material is necessary to convert enough blue light to the required red emission. By contrast, in the structure according to the invention, the manganese-activated fluoride photoluminescence material in its separate respective layer is exposed to blue excitation light individually; thus, more of the blue excitation light can be absorbed by the manganese-activated fluoride photoluminescence material and the remaining blue excitation light can penetrate through to the second photoluminescence layer containing the other photoluminescence materials. Advantageously, in this structure/light emitting device, the manganese-activated fluoride photoluminescence material can more effectively convert the blue excitation light to red emission without competition from other photoluminescence materials such as green/yellow or orange to red emitting photoluminescence materials for example. Therefore, the amount (usage) of a manganese-activated fluoride photoluminescence material required to achieve a target color point can be significantly reduced, up to 60%, compared with known arrangements of a single-layer comprising a mixture of photoluminescence materials. Therefore, a major benefit of the white light emitting devices of the invention is a substantial reduction in manufacturing cost of the device (i.e. package) as significantly less manganese-activated fluoride photoluminescence material is required to attain a desired color point, and further since significantly less total photoluminescence material is required to attain a desired color point.

A further advantage of light emitting devices in accordance with the invention is that the provision of a second photoluminescence layer disposed over the first photoluminescence layer is able to protect and isolate the manganese-activated fluoride photoluminescence material in the first layer from direct contact with any water/moisture in the surrounding environment. Such a multi-layer or two-layer photoluminescence layered structure provides an effective solution to address the poor moisture reliability of manganese-activated fluoride photoluminescence materials, as discussed above. Thus, the inclusion of a second photoluminescence layer provides the benefit of improved moisture reliability to the light emitting device (i.e. LED package). It may be that the second photoluminescence material layer is in direct contact with the first photoluminescence layer. Direct contact improves the ability of the light to traverse the interface between the first and second photoluminescence layers due to the elimination of an air interface.

Yet a further benefit of light emitting devices in accordance with the invention is improved reliability. This is particularly the case in light emitting devices involving a correlated color temperature from 2500K to 3000K (warm white) for example.

In embodiments, the first photoluminescence layer may comprise from 90 wt % to 100 wt % of the manganese-activated fluoride photoluminescence material of the total photoluminescence material content of the first photoluminescence layer. In other embodiments, the first photoluminescence layer may comprise from 95 wt % to 100 wt % of the manganese-activated fluoride photoluminescence material of the total photoluminescence material content of the first photoluminescence layer. In yet further embodiments, the first photoluminescence layer, in terms of photoluminescence materials, consists exclusively (100 wt %) of a manganese-activated fluoride photoluminescence material. It is found that increasing the proportion of manganese-activated fluoride photoluminescence material within the first photoluminescence layer decreases the overall manganese-activated fluoride photoluminescence material used in the device for a given target color, and also decreases the total photoluminescence material used in the device for a given target color.

Typically, the first photoluminescence material layer is in direct contact with the solid-state excitation source; that is, the first photoluminescence layer is disposed or deposited on the solid-state light source. Alternatively, the light emitting device may comprise a light transmissive layer disposed between the solid-state excitation source and the first photoluminescence layer. For example, the light transmissive layer can be disposed on the light on the excitation source; and the first photoluminescence layer disposed on the light transmissive layer. The light transmissive layer can comprise a passivation layer, comprising for example a dimethyl silicone, a phenyl silicone, an epoxy, and/or a light transmissive inorganic oxide material such as a glass.

In embodiments, the manganese-activated fluoride photoluminescence material may comprise $K_2SiF_6:Mn^{4+}$. The manganese-activated fluoride photoluminescence layer, for instance $K_2SiF_6:Mn^{4+}$, may generate light with a peak emission wavelength in a range about 630 nm to about 632 nm.

In embodiments, the manganese-activated fluoride photoluminescence material may comprise $K_2TiF_6:Mn^{4+}$.

In embodiments, the manganese-activated fluoride photoluminescence material may comprise $K_2GeF_6:Mn^{4+}$.

The manganese-activated fluoride photoluminescence material may also comprise a general composition selected from the group consisting of: $K_2SnF_6:Mn^{4+}$, $Na_2TiF_6:Mn^{4+}$, $Na_2ZrF_6:Mn^{4+}$, $Cs_2SiF_6:Mn^{4+}$, $Cs_2TiF_6:Mn^{4+}$, $Rb_2SiF_6:Mn^{4+}$, $Rb_2TiF_6:Mn^{4+}$, $K_3ZrF_7:Mn^{4+}$, $K_3NbF_7:Mn^{4+}$, $K_3TaF_7:Mn^{4+}$, $K_3GdF_6:Mn^{4+}$, $K_3LaF_6:Mn^{4+}$ and $K_3YF_6:Mn^{4+}$.

The manganese-activated fluoride photoluminescence material may comprise from about 30 wt % to 45 wt % of a total photoluminescence material content of the device.

The manganese-activated fluoride photoluminescence material may be dispersed in a light transmissive medium. This may improve the uniformity of photoluminescence light generated by the manganese-activated fluoride photoluminescence material when excited by the excitation source. The light transmissive medium may comprise a dimethyl silicone or phenyl silicone. For better matching the refractive index of the manganese-activated fluoride photoluminescence material, phenyl silicone (refractive index ~1.54) or dimethyl silicone (refractive index 1.41) can be selected in the first photoluminescence layer based on the particular manganese-activated fluoride photoluminescence material used. For instance, $K_2SiF_6:Mn^{4+}$ (refractive index 1.4) may be dispersed in a dimethyl silicone while $K_2TiF_6:Mn^{4+}$ (refractive index >1.5) may be dispersed in a phenyl silicone.

Depending on the dominant wavelength of excitation light generated by the excitation source, the second photoluminescence layer can include photoluminescence materials that generate light with a peak emission wavelength in a range from 440 nm to 625 nm. For example, when the excitation source generates violet or UV light, the second photoluminescence layer can further comprise a photoluminescence material that generate blue light with a peak emission wavelength in a range 440 nm to 470 nm.

The photoluminescence material may be dispersed in a light transmissive medium. This may improve the uniformity of photoluminescence light generated by the photoluminescence material when excited by the excitation source. The light transmissive medium may comprise a dimethyl silicone or phenyl silicone.

The photoluminescence material may comprise a green photoluminescence material that generates light with a peak emission wavelength in a range from 500 nm to 565 nm. The second photoluminescence layer may comprise from 60% to 100% of a total green photoluminescence material content of the device. The green photoluminescence material may comprise a cerium-activated garnet phosphor having a general composition $Y_{3-x}(Al,Ga)_5O_{12}:Ce_x$—YAG phosphor material. The green photoluminescence material may comprise an aluminate phosphor having a general composition $(Lu,Y)_{3-x}(Al,Ga)_5O_{12}:Ce_x$. The green photoluminescence material may comprise silicate phosphors of general composition $A_2SiO_4:Eu^{2+}$ or $A_3SiO_5:Eu^{2+}$ where A=Mg, Ca, Sr and/or Ba.

To improve color rendering, the photoluminescence material may comprise one or more orange to red emitting phosphors. For example the orange to red emitting phosphor can comprise a europium activated nitride-based red emitting phosphor such as a CASN phosphor of general composition $CaAlSiN_3:Eu^{2+}$, for example $(Ca_{1-x}Sr_x)AlSiN_3:Eu$ where $0.5<x\leq1$ or a 2:5:8 nitride-based phosphor of composition $Ba_{2-x}Sr_xSi_5N_8:Eu$ wherein $0\leq x\leq2$. The orange to red emitting phosphor can comprise a Group IIA/IM Selenide Sulfide phosphors of general composition $MSe_{1-x}S_x:Eu$ where M=Mg, Ca, Sr, Ba, Zn or $(Ba,Sr)_3SiO_5:Eu$ phosphor material.

For backlighting applications, the green photoluminescence material can comprise a narrowband green phosphors β-SiAlON or a europium activated sulfide phosphor of general composition and crystal structure $(Ba,Sr,Ca)Ga_2S_4:Eu$.

According to another aspect, there is provided a display backlight package comprising: a solid-state excitation source for generating excitation light with a dominant wavelength in a range 445 nm to 465 nm; and a layered photoluminescence structure comprising: a first photoluminescence layer comprising from 75 wt % to 100 wt % of a manganese-activated fluoride photoluminescence material of the total photoluminescence material content of the first photoluminescence layer, and a second photoluminescence layer comprising photoluminescence material for generating light with a peak emission wavelength in a range from 520 nm to 550 nm; wherein the second photoluminescence layer is disposed on the first photoluminescence layer, and wherein the first photoluminescence layer is in closer proximity to the solid-state excitation source than the second photoluminescence layer.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. Throughout this specification like reference numerals are used to denote like parts.

A packaged white light emitting device 20 in accordance with an embodiment of the invention will now be described with reference to FIG. 2 which shows a sectional side view of the device 20.

The light emitting device 20 is a packaged-type device comprising, for example an SMD 2835 LED package (lead frame) 22. The SMD package 22 comprises a rectangular base 24 and side walls 26A, 26B extending upwardly from opposing edges of the rectangular base 24. The interior surfaces of the side walls 26A, 26B slope inwardly to their vertical axis and together with the interior surface of the solid rectangular base 24 define a cavity 28 in the shape of an inverted frustum of a pyramid.

In this embodiment, the cavity 28 comprises three InGaN (Indium Gallium Nitride) blue (455 nm) LED dies (solid-state excitation sources) 30, and a first photoluminescence layer 32 comprising a manganese-activated fluoride photoluminescence material filling approximately 70% of the cavity 38. The LED dies 30 are serially connected and the rated driving condition is 100 mA, 9 V.

The first photoluminescence layer 32 contains a majority, at least 75 wt %, of manganese-activated fluoride photoluminescence material compared with other photoluminescence materials that may be in the layer. The first photoluminescence layer 32 may contain other materials such as light scattering particles or light diffusive material for example, but the amount of the other materials is typically no more than 30 wt % of the first photoluminescence material layer 32. More particularly, in this embodiment, the first photoluminescence layer 32 only contains $K_2SiF_6:Mn^{4+}$ (KSF), but not other types of photoluminescence materials. Further, in this embodiment, the first photoluminescence layer 32 is constituted by $K_2SiF_6:Mn^{4+}$ dispersed in dimethyl silicone. The first photoluminescence layer 32 is directly in contact with and adjacent the blue LED 30. There are no other photoluminescence materials or photoluminescence material containing layers between the first photoluminescence layer 32 and the blue LED dies 30.

Comparing with known constructions, as shown for example in FIG. 1, in a conventional single-layer light emitting device, the dispensing process during manufacture involves dispensing a mixture of a manganese-activated fluoride photoluminescence material and other photoluminescence material(s) (typically a green phosphor material) which have equal exposure to excitation light, for example blue excitation light. Since a manganese-activated fluoride photoluminescence material may have a much lower blue light absorption capability than other types of photoluminescence materials (for example, a green/yellow garnet-based phosphors), a greater amount of manganese-activated fluoride photoluminescence material is necessary to convert enough blue light to the required red emission. By contrast, in the light emitting device 20 according to the invention, the manganese-activated fluoride photoluminescence material in its separate individual layer 32 is exposed to blue excitation light individually; thus, more of the blue excitation light from the blue LED dies 30 can be absorbed by the manganese-activated fluoride photoluminescence material and the remaining blue excitation light can penetrate through to a second photoluminescence layer(s) 34 for instance. Advantageously, in this light emitting device 20, the first photoluminescence layer 32 can more effectively convert the blue excitation light to red emission without competition from other types of photoluminescence materials present in the second photoluminescence layer 34 for example. Therefore, the amount/usage of a manganese-activated fluoride photoluminescence material required to achieve a target color point can be significantly reduced compared with known arrangements of a single layer comprising a mixture of photoluminescence materials for instance. Moreover, the amount/usage of total photoluminescence material required to achieve a target color point can be significantly reduced compared with known arrangements of a single layer comprising a mixture of photoluminescence materials for instance. Therefore, a benefit of the photoluminescence light emitting device 20 of the invention is a reduction in the manufacturing cost of the device since less (up to 60% less) manganese-activated fluoride photoluminescence material is required to attain a desired color point compared with known single-layer devices. Similarly, a benefit of the photoluminescence light emitting device 20 of the invention is a reduction in the manufacturing cost of the device since less total photoluminescence material is required to attain a desired color point compared with known single-layer devices.

In this embodiment, the cavity 28 also comprises a second photoluminescence layer 34 dispensed on top of the first photoluminescence layer 32 that fills the remaining 30% of the cavity 28. In this embodiment, the second photoluminescence material layer 34 comprises a cerium-activated yellow garnet phosphor having a general composition $Y_3(Al,Ga)_5O_{12}:Ce$. It will be appreciated that the second photoluminescence layer typically comprises green or yellow phosphors or other minority orange red phosphors that work in conjunction with the first photoluminescence layer to create the desired white point.

In this way, the light emitting device 20 effectively is able to isolate the manganese-activated fluoride photoluminescence material contained (dispersed) within the first photoluminescence layer 32 from direct contact with any water/moisture in the surrounding environment. Such a multi-layer or two-layer design of the light emitting device 20 provides an effective solution to address the poor moisture reliability of manganese-activated fluoride photoluminescence materials in known constructions. Thus, the inclusion of the second photoluminescence material layer 34 provides the benefit of improved moisture reliability to the light emitting device (i.e. LED package) 20. A further benefit of the inclusion of the second photoluminescence material layer 34 is that it provides improved moisture reliability to the light emitting device (i.e. LED package) 20 while simultaneously providing a reduction in total photoluminescence material usage in the device. It may otherwise have been expected that a reduction in the total photoluminescence material would have an adverse effect on the moisture reliability to the light emitting device (i.e. LED package) 20, but despite a reduction in total photoluminescence material usage—the light emitting device (i.e. LED package) 20 formed in accordance with the invention exhibits improved moisture reliability.

The first photoluminescence layer 32 is in closer proximity to the blue LED 30 than any other photoluminescence material layer including the second photoluminescence material layer 34; that is the first photoluminescence layer 32 is proximal (i.e. a proximal layer) to the blue LED 30, while the second photoluminescence material layer 34 is distal (i.e. a distal layer) to the blue LED 30.

Figure 2:
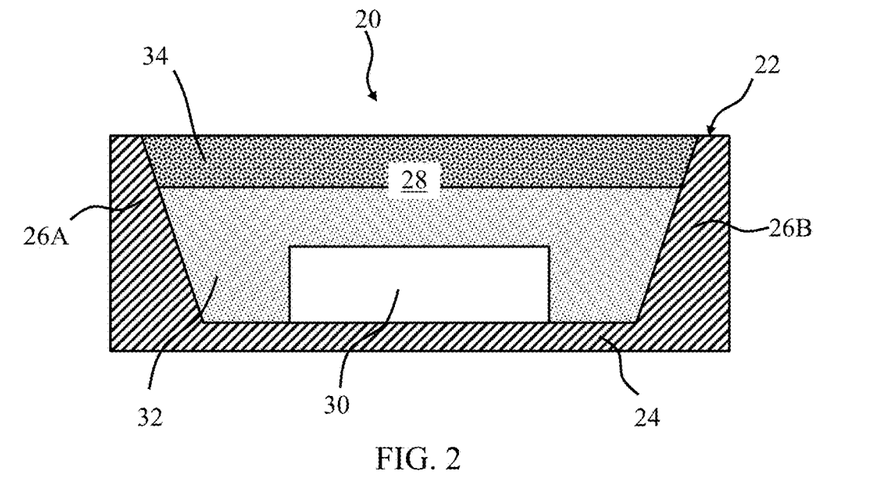
FIG. 2 is a sectional view of a light emitting device in accordance with an embodiment of the invention.
Figure 3:
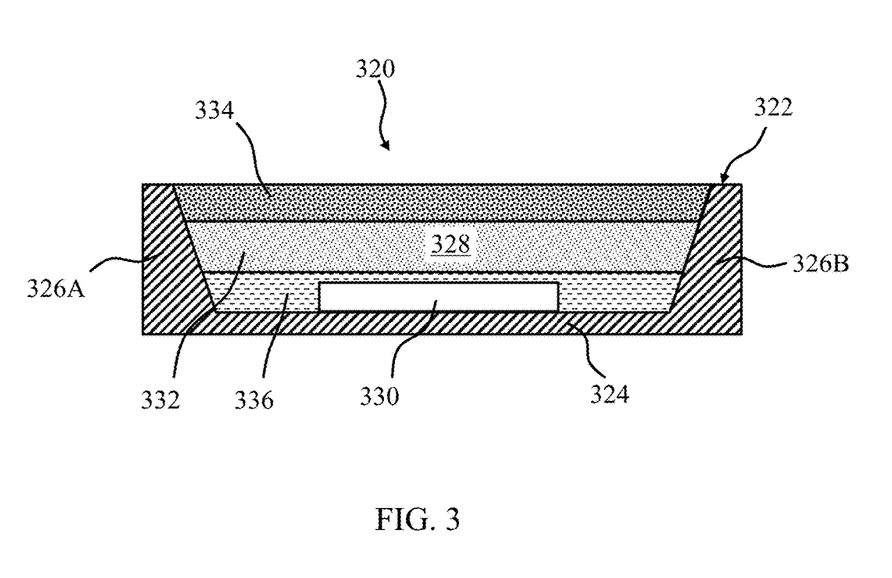
FIG. 3 is a sectional view of a light emitting device in accordance with an embodiment of the invention.

Referring now to FIG. 3, there is shown a packaged white light emitting device 320 (white light emitting device package) formed according to another embodiment of the invention. This embodiment differs from FIG. 2 only in that the light emitting device 320 further comprises a light transmissive (transparent) passivation layer 336 disposed on the blue LEDs dies 330 before the first photoluminescence layer 332. In order to fully protect the first photoluminescence layer 332 from water/moisture, the clear passivation layer 336 is applied over the floor of the cavity 328 and LED dies 330 as shown in FIG. 2. In this embodiment, the passivation layer 336 is a layer of dimethyl silicone. This passivation layer 336 also serves to isolate the bottom electrode (not shown) and blue LED dies 330 from the first photoluminescence layer 332.

The described two-layer light emitting device structure comprising respective first and second photoluminescence layers is not limited to surface mount packaged devices. For instance, it can also be applied in Chip on Board (COB) or Chip Scale Packaging (CSP) applications.

Figure 4A:
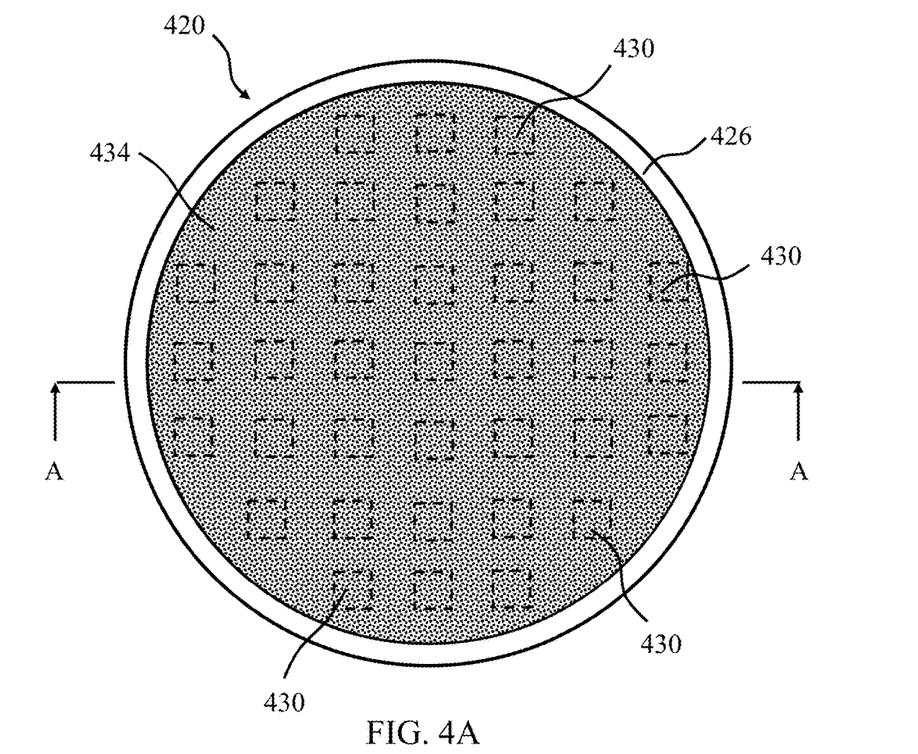
FIG. 4A is a plan view of a white light emitting device in accordance with an embodiment of the invention.
Figure 4B:
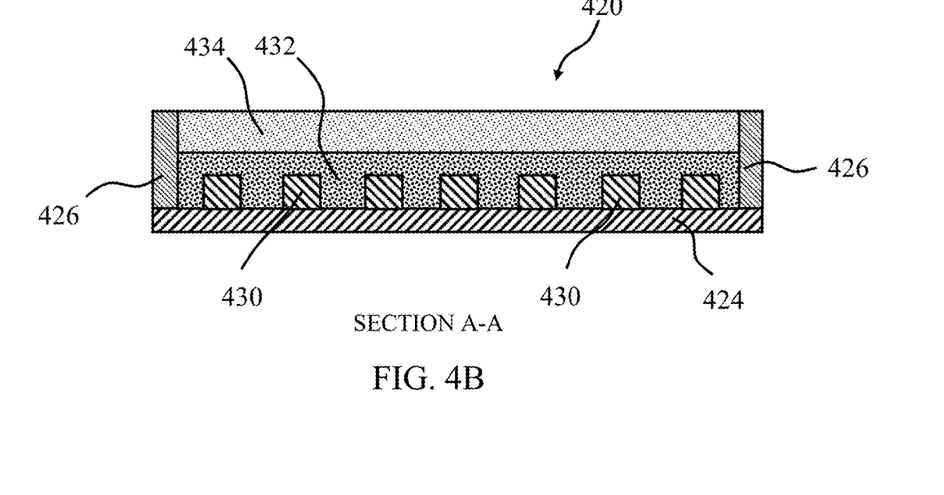
FIG. 4B is cross sectional side view through A-A.

With reference to FIGS. 4A and 4B, there is shown a plan view of a COB light emitting device 420 in accordance with another embodiment of the invention, and a cross section side view through A-A (of FIG. 4A). The light emitting device 420 has a circular shape; thus comprises a circular substrate 424 which is planar and disk shaped. Forming a COB arrangement, 7 arrays (rows) of blue LED dies 430 are evenly distributed on the circular substrate 424. The circular substrate 424 also comprises about its entire perimeter a wall 426 which encloses all the arrays of blue LED dies 430.

A first photoluminescence layer 432 comprising a manganese-activated fluoride photoluminescence material is deposited onto the circular substrate 424 and, in this embodiment, completely covers the blue LEDs 430. Similarly, a second photoluminescence material layer 434 comprising a cerium-activated yellow garnet phosphor having a general composition $Y_3(Al,Ga)_5O_{12}$:Ce is deposited onto the first photoluminescence layer 432 comprising the manganese-activated fluoride photoluminescence material. In this way, the first photoluminescence layer 432 and the second photoluminescence layer 434 are located adjacent one another and also contained within the wall 426.

The light emitting device 420 functions and exhibits the same advantages as discussed in relation the light emitting devices of FIGS. 2 and 3 for example. Hence, the statements made in relation to FIG. 1 apply equally to the embodiment of FIGS. 4A and 4B.

A method of manufacturing the light emitting device, for example, comprises the steps of: providing an array of blue LEDs; dispensing a manganese-activated fluoride photoluminescence material layer (first photoluminescence layer) at least over said array of blue LEDs; and dispensing a second photoluminescence material layer over said manganese-activated fluoride photoluminescence material layer.

Figure 5:
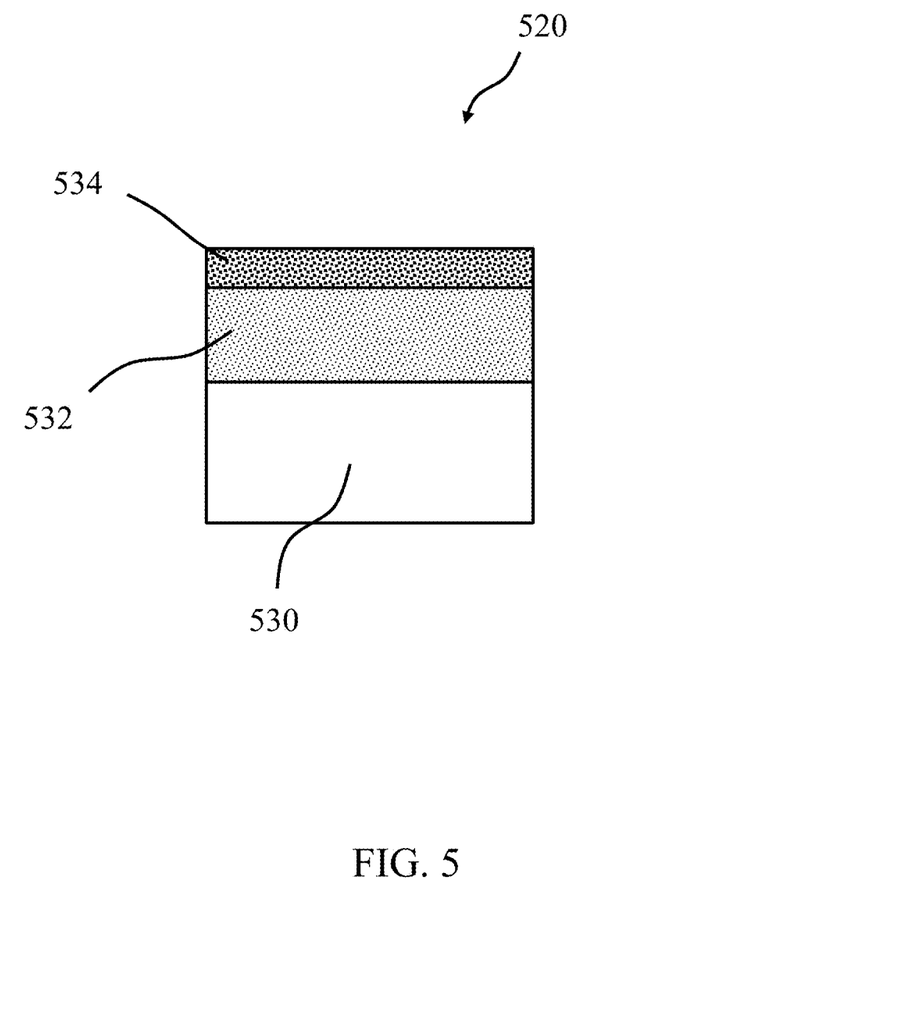
FIG. 5 is a sectional view of a light emitting device in accordance with an embodiment of the invention.

With reference to FIG. 5, there is shown a side view of a CSP light emitting device 520 in accordance with another embodiment of the invention. In this embodiment, a first photoluminescence layer 532 comprising a manganese-activated fluoride photoluminescence material is deposited directly onto the light emitting face of a blue LED die 530. Further, a second photoluminescence material layer 534 comprising, for example, a cerium-activated yellow garnet phosphor having a general composition $Y_3(Al,Ga)_5O_{12}$:Ce is deposited onto the second photoluminescence layer 534. The light emitting device 520 functions and exhibits the same advantages as discussed in relation the light emitting device of FIG. 2 for example. Hence, the statements made in relation to FIG. 2 apply equally to the embodiment of FIG. 5.

Experimental Test Data

In this specification, the following nomenclature is used to denote white light emitting devices: Com.# denotes a comparative (known) white light emitting device comprising a single-phosphor layer and Dev.# denotes a two-phosphor layer white light emitting device in accordance with an embodiment of the invention.

Comparative white light emitting devices (Com.#) and white light emitting devices in accordance with the invention (Dev.#) each comprise SMD 2835 packaged devices containing three serially connected 1133 (11 mil×33 mil) blue LED chips of dominant wavelength $\lambda_d \approx 455$ nm. Each device is a nominal 0.9 W (Drive The rated driving condition is 100 mA and a forward drive voltage $V_f$ of 9 V) device and is intended to generate white light with a target Correlated Color Temperature (CCT) of 2700K and a general color rendering index CRI Ra>90.

The phosphors used in the test devices are KSF ($K_2SiF_6$:$Mn^{4+}$) from Intematix Corporation, green YAG phosphor (Intematix NYAG4156—$(Y, Ba)_{3-x}(Al_{1-y}Ga_y)_5O_{12}$:$Ce_x$ Peak emission wavelength $\lambda_{pe}=550$ nm) and CASN ($Ca_{1-x}Sr_x$-$AlSiN_3$:Eu $\lambda_{pe} \approx 615$ nm). The CASN is included to achieve the 2700K color target and general CRI Ra>90.

For the single-layer comparative devices, Com.#, the three phosphors (KSF, YAG and CASN) were mixed in a phenyl silicone and the mixture dispensed into the 2835 package to fill the cavity. The single-phosphor layer is then cured in an oven.

For the two-layer devices (Dev.#): KSF phosphor is mixed into a phenyl silicone and dispensed into the 2835 package to partially fill the LED cavity. The KSF phosphor layer is cured in an oven. YAG phosphor is mixed with a phenyl silicone and then dispensed on top of KSF layer to fully fill the LED cavity and the cured in an oven. The KSF phosphor layer can additionally include CASN and/or YAG.

Optical Performance

The test method involves measuring total light emission of the packaged white light emitting devices in an integrating sphere.

TABLE 1 tabulates phosphor composition of a comparative device Com.1 (single-layer device) and a two-layer device Dev.1 in accordance with the invention. TABLE 2 tabulates total phosphor usage for the single-layer device (Com.1) and the two-layer device (Dev.1). The phosphor weight values (weight) in TABLES 1 and 2 are normalized to the weight of KSF in the single phosphor layer of comparative device Com.1.

As can be seen from TABLE 1, in terms of phosphor composition: Com. 1 comprises a single phosphor layer comprising a mixture of 69.9 wt % (weight=1.000) KSF, 28.1 wt % (weight=0.400) YAG and 2.1 wt % (weight=0.030) CASN. Dev.1 comprises a two-layered phosphor structure having a $1^{st}$ phosphor layer comprising a mixture of 95.2 wt % (weight=0.457) KSF and 4.8 wt % (weight=0.023) CASN and a $2^{nd}$ phosphor layer comprising 100.0 wt % (weight=0.561) YAG.

TABLE 1

Phosphor composition of a single-layer LED (Com. 1) and a two-layer LED (Dev. 1)

| | 1st phosphor layer | | | | | | 2nd phoshor layer | | | |
| --- | --- | --- | --- | --- | --- | --- | --- | --- | --- | --- |
| | KSF | | YAG | | CASN | | YAG | | CASN | |
| Device | weight[1] | wt %[2] | weight[1] | wt %[2] | weight[1] | wt %[2] | weight[1] | wt % | weight[1] | wt %[2] |
| Com. 1 | 1.000 | 69.9 | 0.400 | 28.0 | 0.030 | 2.1 | — | — | — | — |
| Dev. 1 | 0.457 | 95.2 | — | — | 0.023 | 4.8 | 0.561 | 100.0 | — | — |

[1]weight - phosphor weight normalized to weight of KSF of a single phosphor layer of comparative device (Com. 1)
[2]wt % - phosphor weight percentage of total phosphor content of the layer

TABLE 2

Phosphor usage of a single-layer LED (Com. 1) and a two-layer LED (Dev. 1)

| | Phosphor usage | | | | | | | | | TOTAL |
| --- | --- | --- | --- | --- | --- | --- | --- | --- | --- | --- |
| | KSF | | | YAG | | | CASN | | | |
| Device | weight[1] | % | wt %[3] | weight[1] | % | wt %[3] | weight[1] | % | wt %[3] | weight[1] |
| Com. 1 | 1.000 | 100.0 | 69.9 | 0.400 | 100.0 | 28.0 | 0.030 | 100 | 2.1 | 1.430 |
| Dev. 1 | 0.457 | 46.0 | 43.9 | 0.561 | 129.0 | 53.9 | 0.023 | 76 | 2.2 | 1.041 |

[1]weight - phosphor weight normalized to weight of KSF of a single phosphor layer of comparative device (Com. 1)
[3]wt % - phosphor weight percentage of total phosphor content of device TABLE 3 tabulates the measured optical performance of the light emitting devices Com.1 and Dev.1. As can be seen from TABLE 3, the color point of light generated by the devices are very similar with the flux generated by the two layer-device of the invention (Dev.1) being 4.1 lm greater (3.4% brighter: Brightness-Br) than the single-layer comparative device (Com.1). However, as can be seen from TABLE 2, compared with the single-layer device Com.1, KSF usage of the two-layer device Dev.1 in accordance with the invention is reduced from a normalized weight (weight) 1.000 to 0.457, that is a 54% reduction in the amount of KSF usage compared with Com. 1. Moreover, CASN usage of the two-layer device Dev.1 is also reduced from a normalized weight 0.030 to 0.023, that is a 24% reduction in CASN usage compared with Com.1. While there is an increase of 29% (0.561 from 0.400) in YAG usage, total phosphor usage is reduced from weight=1.430 to 1.041, that is a reduction of 28% total phosphor usage. As noted above, YAG is inexpensive compared with both KSF (typically 1/100 to 1/150 of the cost) and CASN (typically at least 1/20 of the cost). Consequently, since YAG is a fraction of the cost of KSF or CASN, the overall cost of the device is dramatically reduced in this way. As well as the cost saving afforded by the reduction in KSF and CASN content, two-layer devices in accordance with the invention are easier to manufacture as they use less total phosphor material which means that the phosphor material loading in silicone is reduced and this reduction can increase the reliability/stability of the dispensing process.

It is believed that the reason for the increase in YAG usage is that due to less blue excitation light reaching the 2nd phosphor layer, more YAG phosphor is required to generate green light to attain the selected color target. As discussed above, it is believed that since the KSF layer contains substantially only KSF (individual KSF layer), KSF usage is reduced, because the KSF can absorb blue excitation light without having to compete with the YAG phosphor which is otherwise the case in the known single-layer devices comprising a single layer having a mixture of phosphors.

TABLE 3

Measured optical performance of a single-layer device (Com. 1) and a two-layer device (Dev. 1)

| | CIE | | Flux | Br | CRI | | | |
| --- | --- | --- | --- | --- | --- | --- | --- | --- |
| Device | x | y | (lm) | (%) | Ra | ΔRa | R9 | ΔR9 |
| Com. 1 | 0.4544 | 0.4183 | 121.7 | 100.0 | 90.3 | 0.0 | 57.6 | 0.0 |
| Dev. 1 | 0.4548 | 0.4208 | 125.8 | 103.4 | 90.9 | 0.6 | 57.4 | −0.2 |

TABLE 4 tabulates phosphor composition of a comparative device Com.2 (single-layer device) and two-layer devices Dev.2 to Dev.5 in accordance with the invention for increasing proportion (wt %) of KSF in the 1st phosphor layer. TABLE 5 tabulates total phosphor usage for the single-layer device (Com.2) and the two-layer devices (Dev.2 to Dev.5). The phosphor weights in TABLES 4 and 5 are normalized to the weight of KSF in the comparative device Com.2.

As can be seen from TABLE 4, in terms of phosphor composition: Com.2 comprises a single phosphor layer comprising a mixture of 68.9 wt % (weight=1.000) KSF, 29.0 wt % (weight=0.421) YAG and 2.1 wt % (weight=0.031) CASN. Devices Dev.2 to Dev.5 comprise a 1st phosphor layer having an increasing proportion (wt %) of KSF in the 1st phosphor layer (76.8 wt % to 100 wt %). More specifically: Dev.2 comprises a two-layered structure having a 1st phosphor layer comprising a mixture of 76.8 wt % (weight=0.770) KSF, 3.2 wt % (weight=0.032) CASN and 20.0 wt % (weight=0.200) YAG, and a 2nd phosphor layer comprising 100.0 wt % YAG (weight=0.345); Dev.3 comprises a two-layered structure having a 1st phosphor layer comprising a mixture of 86.4 wt % (weight=0.665) KSF, 3.6 wt % (weight=0.028) CASN and 10.0 wt % (weight=0.077) YAG and a $2^{nd}$ phosphor layer comprising 100.0 wt % YAG (weight=0.506); Dev.4 comprises a two-layered structure having a $1^{st}$ phosphor layer comprising a mixture of 95.9 wt % (weight=0.639) KSF, 4.1 wt % (weight=0.0270) CASN and a $2^{nd}$ phosphor layer comprising 100.0 wt % YAG (weight=0.580); and Dev.5 comprises a two-layered structure having a $1^{st}$ phosphor layer comprising 100.0 wt % (weight=0.551) KSF and a $2^{nd}$ phosphor layer comprising a mixture of 96.0 wt % YAG (weight=0.595) and 4.0 wt % (weight=0.025) CASN.

$1^{st}$ phosphor layer. It will be noted from TABLE 5 that the greatest reduction in KSF usage is when the $1^{st}$ phosphor layer, in terms of total phosphor content of the layer, exclusively comprises KSF (i.e. Dev.5-100 wt % KSF in $1^{st}$ phosphor layer). This being said, it will be appreciated that even for a device having about a 75% wt % proportion of KSF of a total phosphor content in the $1^{st}$ phosphor layer (Dev.2), the saving in KSF usage is still about 25% which is substantial when the high cost of KSF is taken into account, resulting in nearly a 25% reduction in the overall cost of the manufacturing of the device.

TABLE 4

Phosphor composition of a single-layer LED (Com. 2) and two-layer LEDs (Dev. 2 to Dev. 5) with increasing wt % KSF content in $1^{st}$ layer

| | $1^{st}$ phosphor layer | | | | | | $2^{nd}$ phosphor layer | | | | |
|---|---|---|---|---|---|---|---|---|---|---|---|
| | KSF | | YAG | | CASN | | YAG | | | CASN | |
| Device | weight[1] | wt %[2] | weight[1] | wt %[2] | weight[1] | wt %[2] | weight[1] | wt %[2] | %[4] | Weight[1] | wt %[2] |
| Com. 2 | 1.000 | 68.9 | 0.421 | 29.0 | 0.031 | 2.1 | — | — | — | — | — |
| Dev. 2 | 0.770 | 76.8 | 0.200 | 20.0 | 0.032 | 3.2 | 0.345 | 100.0 | 63.3 | — | — |
| Dev. 3 | 0.665 | 86.4 | 0.077 | 10.0 | 0.028 | 3.6 | 0.506 | 100.0 | 86.8 | — | — |
| Dev. 4 | 0.639 | 95.9 | — | — | 0.027 | 4.1 | 0.580 | 100.0 | 100.0 | — | — |
| Dev. 5 | 0.551 | 100.0 | — | — | — | — | 0.595 | 96.0 | 100.0 | 0.025 | 4.0 |

[1]weight - phosphor weight normalized to weight of KSF of a single phosphor layer of comparative device (Com.1)
[2]wt % - phosphor weight percentage of total phosphor content of the layer
[4]% - percentage of total YAG content of device in $2^{nd}$ phosphor layer

TABLE 5

Phosphor usage of a single-layer LED (Com. 1) and a two-layer LED (Dev. 1)

| | Phosphor usage | | | | | | | | | |
|---|---|---|---|---|---|---|---|---|---|---|
| | KSF | | | YAG | | | CASN | | | TOTAL |
| Device | weight[1] | % | wt %[3] | weight[1] | % | wt %[3] | weight[1] | % | wt %[3] | weight[1] |
| Com. 2 | 1.000 | 100 | 56.6 | 0.715 | 100 | 40.5 | 0.052 | 100 | 2.9 | 1.767 |
| Dev. 2 | 0.770 | 77 | 44.0 | 0.925 | 129 | 52.9 | 0.054 | 104 | 3.1 | 1.749 |
| Dev. 3 | 0.665 | 67 | 39.1 | 0.990 | 138 | 58.2 | 0.047 | 90 | 2.8 | 1.702 |
| Dev. 4 | 0.639 | 64 | 38.3 | 0.985 | 138 | 59.0 | 0.045 | 87 | 2.7 | 1.669 |
| Dev. 5 | 0.551 | 55 | 34.4 | 1.009 | 141 | 63.0 | 0.042 | 81 | 2.6 | 1.602 |

[1]weight - phosphor weight normalized to weight of KSF of a single phosphor layer of comparative device (Com. 1)
[3] wt % - phosphor weight percentage of total phosphor content of device TABLE 6 tabulates the measured optical performance of the light emitting devices Com.2 and Dev.2 to Dev.5. As can be seen from TABLE 6, the optical performance/color point of the devices are very similar with the flux generated by the two layer-devices of the invention (Dev.2 to Dev.5) being between about 0.7% and 2.4% brighter (Brightness-Br) than the single-layer comparative device (Com.2). However, as can be seen from TABLE 5, compared with the single-layer device Com.2, KSF usage of the two-layer devices Dev.2 to Dev.5 in accordance with the invention is reduced by 23% up to 45% depending on the proportion (wt %) of KSF in the As evidenced in TABLE 5, increasing the proportion (wt %) of KSF in the $1^{st}$ phosphor layer has the effect of (i) reducing KSF usage (23% to 45%), (ii) reducing CASN usage, (iii) increasing YAG usage, and (iv) reducing total phosphor usage. These effects together provide a significant cost reduction.

It will be further noted that in devices in accordance with the invention, the $2^{nd}$ phosphor layer can comprise from about 60% (Dev.2) to 100% (Devs.4 and 5) YAG (green photoluminescence material) of the total YAG content of the device.

TABLE 6

Optical performance of single-layer LED (Com. 2) and two-layer LEDs (Dev. 2 to Dev. 5)

| | CIE | | CCT | Flux | LE | Br | CRI | | | |
|---|---|---|---|---|---|---|---|---|---|---|
| Device | x | y | (K) | (lm) | (lm/W) | (%) | Ra | ΔRa | R9 | ΔR9 |
| Com. 2 | 0.4591 | 0.4169 | 2759 | 110.1 | 345.4 | 100.0 | 93.5 | 0.0 | 65.5 | 0.0 |
| Dev. 2 | 0.4591 | 0.4173 | 2763 | 111.2 | 347.2 | 100.9 | 92.5 | −1.0 | 61.4 | −4.1 |

TABLE 6-continued

Optical performance of single-layer LED (Com. 2) and two-layer LEDs (Dev. 2 to Dev. 5)

| Device | CIE x | CIE y | CCT (K) | Flux (lm) | LE (lm/W) | Br (%) | CRI Ra | ΔRa | R9 | ΔR9 |
|---|---|---|---|---|---|---|---|---|---|---|
| Dev. 3 | 0.4587 | 0.4170 | 2767 | 111.7 | 345.8 | 101.4 | 93.0 | −0.5 | 64.1 | −1.4 |
| Dev. 4 | 0.4589 | 0.4175 | 2766 | 110.9 | 345.3 | 100.7 | 93.5 | 0.0 | 67.5 | 2.0 |
| Dev. 5 | 0.4599 | 0.4135 | 2722 | 112.8 | 341.7 | 102.4 | 94.8 | 1.3 | 79.0 | 13.5 |

Thermal Performance

TABLE 7 tabulates the thermal stability of the single-layer light emitting device Com.1 and two-layer light emitting device Dev.1. As can be seen from TABLE 7, compared with the single-layer device Com.1, the two-layer devices Dev.1 in accordance with the invention exhibits greater thermal stability in terms of light emission and emission color stability.

For example, the average flux generated by Dev.1 drops 12.3% (116.5 lm to 102.1 lm) when operated at 85° C. (H) compared with being operated at 25° C. (C). In comparison, the average flux generated by Com.1 drops 12.7% (From 115.9 lm to 101.2 lm) when operated at 85° C. (H) compared with being operated at 25° C. (C).

In terms of luminous efficacy (LE), the average value of LE of Dev.1 drops 10.4% (From 123.1 lm/W to 110.4 lm/W) when operated at 85° C. (H) compared with being operated at 25° C. (C). In comparison, the average value of LE of Com.1 drops 11.6% (From 122.9 lm/W to 108.6 lm/W) when operated at 85° C. (H) compared with being operated at 25° C. (C). This demonstrates the superior thermal stability of a device formed in accordance with the invention since the drop in average LE of 10.4% (Dev.1) is less than the drop of 11.6% (Com.1).

In terms of general color rendering index CRI Ra, the average value of CRI Ra of Dev.1 increases by an amount of only 1.5 (From 93.7 to 95.2) when operated at 85° C. (H) compared with being operated at 25° C. (C). In comparison, the average value of CRI Ra of Com.1 increases by an amount 2.1 (From 91.2 to 93.3) when operated at 85° C. (H) compared with being operated at 25° C. (C). This demonstrates the superior thermal stability of a device formed in accordance with the invention since the increase of average CRI Ra of 1.5 (Dev.1) is less than the increase of 2.0 (Com.1).

In terms of color rendering index CRI R8, the average value of CRI R8 of Dev.1 increases by an amount of only 0.6 (From 97.1 to 97.7) when operated at 85° C. (H) compared with being operated at 25° C. (C). In comparison, the average value of CRI R8 of Com.1 increases by an amount 1.2 (From 82.7 to 83.9) when operated at 85° C. (H) compared with being operated at 25° C. (C). This demonstrates the superior thermal stability of a device formed in accordance with the invention since the increase of average CRI R8 of 0.6 (Dev.1) is less than the increase of 1.2 (Com.1),In terms of color rendering index CRI R9, the average value of CRI R9 of Dev.1 increases by an amount of only 2.3 (From 83.3 to 85.5) when operated at 85° C. (H) compared with being operated at 25° C. (C). In comparison, the average value of CRI R9 of Com.1 increases by an amount 5.7 (From 57.4 to 63.1) when operated at 85° C. (H) compared with being operated at 25° C. (C). This demonstrates the superior thermal stability of a device formed in accordance with the invention since the increase of average CRI R9 of 2.3 (Dev.1) is less than the increase of 5.7 (Com.1).

TABLE 7

Thermal stability of a single-layer LED (Com. 1) and two-layer LED (Dev. 1)

| Device | Condition | Flux (lm) | LE (lm/W) | CIE x | CIE y | CRI Ra | R8 | R9 |
|---|---|---|---|---|---|---|---|---|
| Com. 1 | Cold (C) 25° C. | 115.0 | 123.2 | 0.4542 | 0.4073 | 91.0 | 82.4 | 57.0 |
| | | 117.3 | 119.8 | 0.4534 | 0.4083 | 91.3 | 82.5 | 57.3 |
| | | 115.4 | 125.6 | 0.4523 | 0.4101 | 91.4 | 83.0 | 57.8 |
| | Average | 115.9 | 122.9 | 0.4533 | 0.4086 | 91.2 | 82.7 | 57.4 |
| | Hot (H) 85° C. | 100.4 | 107.1 | 0.4579 | 0.3985 | 92.9 | 83.4 | 62.2 |
| | | 102.9 | 109.6 | 0.4570 | 0.3991 | 93.4 | 83.9 | 63.2 |
| | | 100.2 | 109.1 | 0.4562 | 0.4008 | 93.5 | 84.4 | 63.9 |
| | Average | 101.2 | 108.6 | 0.4570 | 0.3995 | 93.3 | 83.9 | 63.1 |
| | Δ C to H | −12.7% | −13.1% | 0.0037 | −0.0088 | 1.9 | 1.0 | 5.2 |
| | | −12.3% | −8.5% | 0.0036 | −0.0092 | 2.1 | 1.4 | 5.9 |
| | | −13.2% | −13.1% | 0.0039 | −0.0093 | 2.1 | 1.4 | 6.1 |
| | Average | −12.7% | −11.6% | 0.0040 | −0.0090 | 2.1 | 1.2 | 5.7 |
| Dev. 1 | Cold (C) 25° C. | 118.5 | 125.0 | 0.4456 | 0.4322 | 92.7 | 96.0 | 79.4 |
| | | 116.7 | 126.2 | 0.4467 | 0.4298 | 93.6 | 96.8 | 81.7 |
| | | 114.4 | 118.2 | 0.4512 | 0.4265 | 94.7 | 98.4 | 88.9 |
| | Average | 116.5 | 123.1 | 0.4478 | 0.4295 | 93.7 | 97.1 | 83.3 |
| | Hot (H) 85° C. | 103.9 | 112.3 | 0.4495 | 0.4242 | 94.5 | 96.7 | 82.1 |
| | | 102.3 | 112.1 | 0.4505 | 0.4216 | 95.4 | 97.3 | 84.2 |
| | | 100.2 | 106.8 | 0.4553 | 0.4182 | 95.7 | 99.0 | 90.5 |
| | Average | 102.1 | 110.4 | 0.4502 | 0.4213 | 95.2 | 97.7 | 85.6 |
| | Δ C to H | −12.3% | −10.1% | 0.0039 | −0.0080 | 1.8 | 0.7 | 2.7 |

TABLE 7-continued

Thermal stability of a single-layer LED (Com. 1) and two-layer LED (Dev. 1)

| Device | Condition | Flux (lm) | LE (lm/W) | CIE x | CIE y | CRI Ra | CRI R8 | CRI R9 |
|---|---|---|---|---|---|---|---|---|
| | | −12.3% | −11.3% | 0.0038 | −0.0082 | 1.8 | 0.5 | 2.5 |
| | | −12.4% | −9.7% | 0.0041 | −0.0083 | 1.0 | 0.6 | 1.6 |
| | Average | −12.3% | −10.4% | 0.0040 | −0.0080 | 1.5 | 0.6 | 2.3 |

Yet a further benefit of light emitting devices formed in accordance with the invention is improved reliability. This is particularly the case in light emitting devices intended for general light that generate warm light with a correlated color temperature from 2500K to 3000K for example.

Figure 6:
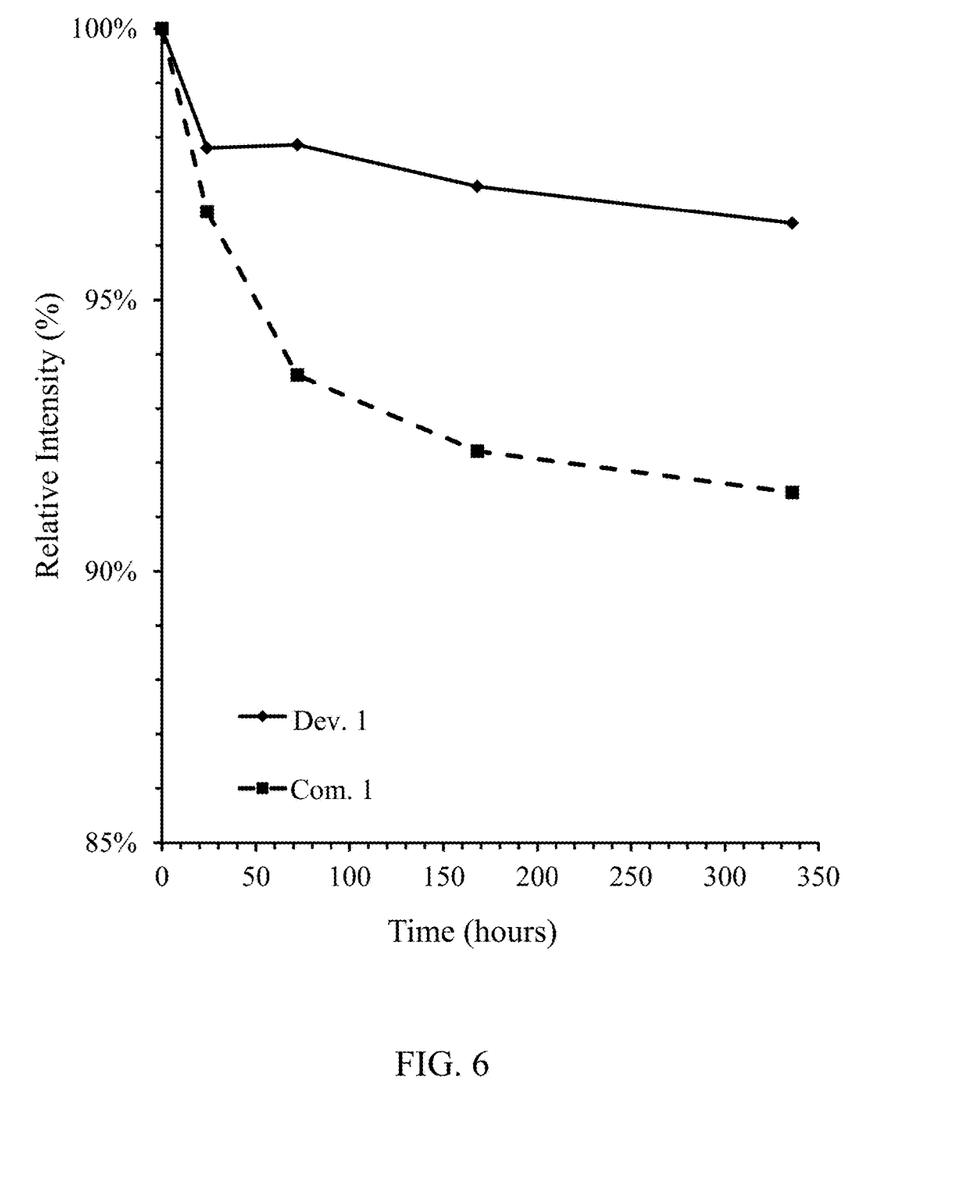
FIG. 6 shows reliability data, relative intensity versus time, for devices operated under accelerated testing conditions 85° C./85% RH for (i) a known 2700 K light emitting device (Com. 1) and (ii) a 2700K light emitting device (Dev. 1) according to some embodiments.

The reliability, relative brightness, of a light emitting device in accordance with the invention (Dev.1) comprising two-layers is compared with the reliability of a known device (Com.1) comprising a single-layer of mixed photoluminescence materials under Wet High Temperature Operation Life test condition (WHTOL), temperature of 85° C., relative humidity of 85%. The driving condition is 9V and 120 mA. As shown in FIG. 6, the two-layer LED's (Dev.1) relative intensity at 336 hrs is 96.4% while the relative intensity of the known single-layer LED (Com. 1) dropped to 91.45% at 336 hrs. It is believed that this improvement in reliability is due to a combination of the reduced usage of KSF phosphor as discussed above and the protection provided by the $2^{nd}$ photoluminescence layer covering the manganese-activated fluoride photoluminescence layer ($1^{st}$ layer).

Another accelerated reliability is a water boiling test. In this test, the LEDs were immersed in 85° C. deionized water for 4 hours. The LED brightness is tested before and after immersion in water. The results of this test are tabulated in TABLE 8. Under these conditions, it is believed that hot water may penetrate the upper photoluminescence layer silicone surface to react with Fluoride photoluminescence material. The two-layer device of the invention provides increased isolation between water and the KSF (manganese-activated fluoride photoluminescence material) in the $1^{st}$ phosphor layer, resulting in better lumen maintenance than the single-layer device.

TABLE 8

Relative brightness of single-layer LEDs (Com. 1) and two-single-layer LEDs (Dev. 1) under immersion in boiling water (85° C.) for 4 hours Relative Brightness (%) after 4 hours

| Device | 1 | 2 | 3 | 4 | 5 | 6 | 7 | 8 | 9 | 10 | max | min | avg |
|---|---|---|---|---|---|---|---|---|---|---|---|---|---|
| Com. 1 | 95.4 | 96.4 | 96.7 | 93.9 | 94.7 | 96.1 | 93.5 | 94.1 | 93.0 | 94.6 | 96.7 | 93.0 | 94.8 |
| Dev. 1 | 97.3 | 97.1 | 97.5 | 97.6 | 98.0 | 98.3 | 98.2 | 98.0 | 98.4 | 97.3 | 98.4 | 97.1 | 97.8 |

The invention claimed is:

1. A white light emitting package comprising:

a solid-state excitation source for generating excitation light with a dominant wavelength in a range 440 nm to 470 nm; and a layered photoluminescence structure comprising:

a first photoluminescence layer comprising from 75 wt % to 100 wt % of a manganese-activated fluoride photoluminescence material of the total photoluminescence material content of the first photoluminescence layer, and a second photoluminescence layer comprising photoluminescence material for generating light with a peak emission wavelength in a range from 500 nm to 650 nm;

wherein the second photoluminescence layer is disposed on the first photoluminescence layer, and wherein the first photoluminescence layer is disposed adjacent to the solid-state excitation source.

2. The light emitting device of claim 1, wherein the first photoluminescence layer comprises at least one of: from 90 wt % to 100 wt % of the manganese-activated fluoride photoluminescence material of the total photoluminescence material content of the first photoluminescence layer, and from 95 wt % to 100 wt % the manganese-activated fluoride photoluminescence material of the total photoluminescence material content of the first photoluminescence layer.

3. The light emitting device of claim 1, further comprising a light transmissive layer, wherein the light transmissive layer is disposed on the excitation source; and wherein the first photoluminescence layer is disposed on the light transmissive layer.

4. The light emitting device of claim 3, wherein the light transmissive layer comprises a passivation layer.

5. The light emitting device of claim 4, wherein the passivation layer is selected from the group consisting of: a dimethyl silicone, a phenyl silicone, an epoxy, and a light transmissive inorganic oxide material.

6. The light emitting device of claim 1, wherein the manganese-activated fluoride photoluminescence material layer comprises at least one of: $K_2SiF_6:Mn^{4+}$, $K_2TiF_6:Mn^{4+}$, and $K_2GeF_6:Mn^4$.

7. The light emitting device of claim 1, wherein the manganese-activated fluoride photoluminescence material comprises from about 30 wt % to 45 wt % of a total photoluminescence material content of the device.

8. The light emitting device of claim 1, wherein at least one of the manganese-activated fluoride photoluminescence material or the photoluminescence material is dispersed in a light transmissive medium.

9. The light emitting device of claim 8, wherein the light transmissive medium comprises a dimethyl silicone or phenyl silicone.

10. The light emitting device of claim 1, wherein the photoluminescence material in the second photoluminescence layer comprises a green photoluminescence material that generates light with a peak emission wavelength in a range from 500 nm to 565 nm.

11. The light emitting device of claim 10, wherein the second photoluminescence layer comprises from 60% to 100% of a total green photoluminescence material content of the device.

12. The light emitting device of claim 10, wherein the green photoluminescence material comprises a cerium-activated garnet phosphor having a general composition $(Lu,Y)_{3-x}(AlGa)_5O_{12}:Ce_x$ or $Y_3(Al,Ga)_5O_{12}:Ce$.

13. The light emitting device of claim 1, wherein the first or second photoluminescence layer comprises an orange to red photoluminescence material for generating light with a peak emission wavelength in a range from 580 nm to 650 nm.

14. The light emitting device of claim 13, wherein the orange to red photoluminescence material comprises a nitride-based phosphor having a general composition $CaAlSiN_3:Eu^{2+}$, $Ca(Se, S):Eu^{2+}$, or $(Ba, Sr)_3SiO_5:Eu^{2+}$.

15. The light emitting device of claim 1, wherein the second photoluminescence layer comprises a mixture of a first photoluminescence material for generating light with a peak emission wavelength in a range 500 nm to 565 nm and a second photoluminescence material for generating light with a peak emission wavelength in a range 600 nm to 650 nm.

16. The light emitting device of claim 1, wherein the manganese-activated fluoride photoluminescence material comprises less than 45 wt % of a total photoluminescence material content of the device.

17. The light emitting device of claim 1, wherein the relative intensity of light generated by the device is at least 95% after 300 hours of operation under Wet High Temperature Operation Life test condition with a temperature of 85° C. and a relative humidity of 85%.

18. A display backlight package comprising:
a solid-state excitation source for generating excitation light with a dominant wavelength in a range 445 nm to 465 nm; and
a layered photoluminescence structure comprising:
a first photoluminescence layer comprising from 75 wt % to 100 wt % of a manganese-activated fluoride photoluminescence material of the total photoluminescence material content of the first photoluminescence layer, and
a second photoluminescence layer comprising photoluminescence material for generating light with a peak emission wavelength in a range from 520 nm to 550 nm;
wherein the second photoluminescence layer is disposed on the first photoluminescence layer, and wherein the first photoluminescence layer is disposed adjacent to the solid-state excitation source.

19. A white light emitting package comprising:
a solid-state excitation source for generating excitation light with a dominant wavelength in a range 440 nm to 470 nm; and
a layered photoluminescence structure comprising:
a first photoluminescence layer comprising from 75 wt % to 100 wt % of a manganese-activated fluoride photoluminescence material of the total photoluminescence material content of the first photoluminescence layer, and
a second photoluminescence layer comprising photoluminescence material for generating light with a peak emission wavelength in a range from 500 nm to 650 nm;
wherein the second photoluminescence layer is disposed on the first photoluminescence layer, and wherein the first photoluminescence layer is disposed adjacent to the solid-state excitation source; and
wherein the relative intensity of light generated by the device is at least 95% after 300 hours of operation under Wet High Temperature Operation Life test condition with a temperature of 85° C. and a relative humidity of 85%.

20. A white light emitting package comprising:
a solid-state excitation source for generating excitation light with a dominant wavelength in a range 440 nm to 470 nm; and
a layered photoluminescence structure comprising:
a first photoluminescence layer comprising from 75 wt % to 100 wt % of a manganese-activated fluoride photoluminescence material of the total photoluminescence material content of the first photoluminescence layer, and
a second photoluminescence layer comprising photoluminescence material for generating light with a peak emission wavelength in a range from 500 nm to 650 nm;
wherein the second photoluminescence layer is disposed on the first photoluminescence layer, and wherein the first photoluminescence layer is disposed adjacent to the solid-state excitation source; and
wherein the manganese-activated fluoride photoluminescence material comprises less than 45 wt % of a total photoluminescence material content of the device.

* * * * *